(12) United States Patent
Aubigny et al.

(10) Patent No.: US 8,151,955 B2
(45) Date of Patent: Apr. 10, 2012

(54) ELECTRICAL EQUIPMENT ARRANGED IN THE ROOF OF AN ELECTRICALLY DRIVEN RAILWAY VEHICLE

(75) Inventors: Christophe Aubigny, Sarniguet (FR); Nicolas Quentin, Ibos (FR)

(73) Assignee: Alstom Transport S.A., Levallois Perret (FR)

( * ) Notice: Subject to any disclaimer, the term of this patent is extended or adjusted under 35 U.S.C. 154(b) by 0 days.

(21) Appl. No.: 12/526,859

(22) PCT Filed: Feb. 5, 2008

(86) PCT No.: PCT/FR2008/000139
§ 371 (c)(1),
(2), (4) Date: Aug. 12, 2009

(87) PCT Pub. No.: WO2008/113903
PCT Pub. Date: Sep. 25, 2008

(65) Prior Publication Data
US 2010/0006385 A1     Jan. 14, 2010

(30) Foreign Application Priority Data
Feb. 20, 2007  (FR) .................................. 07 01206

(51) Int. Cl.
*B60L 1/00*  (2006.01)
(52) U.S. Cl. .............................. 191/2; 191/45 R; 191/50
(58) Field of Classification Search ............ 191/2, 45 R, 191/50
See application file for complete search history.

(56) References Cited

U.S. PATENT DOCUMENTS

| | | | |
|---|---|---|---|
| 5,629,592 A * | 5/1997 | Henmi | 318/107 |
| 5,644,212 A * | 7/1997 | Takahashi | 320/134 |
| 6,371,265 B1 * | 4/2002 | Arrouy et al. | 191/2 |
| 6,557,476 B2 * | 5/2003 | Batisse | 104/289 |
| 6,608,396 B2 * | 8/2003 | Downer et al. | 290/40 C |
| 6,612,246 B2 * | 9/2003 | Kumar | 105/34.2 |
| 6,615,118 B2 * | 9/2003 | Kumar | 701/19 |
| 6,642,679 B2 * | 11/2003 | Nagatake et al. | 318/139 |
| 6,953,100 B2 * | 10/2005 | Aberle et al. | 429/432 |
| 7,791,292 B2 * | 9/2010 | Glasl et al. | 318/139 |
| 2002/0117368 A1 * | 8/2002 | Ogasawara | 191/2 |
| 2002/0139629 A1 * | 10/2002 | Nogaret et al. | 191/2 |

(Continued)

FOREIGN PATENT DOCUMENTS

EP    0 594 457 A1    4/1994

(Continued)

*Primary Examiner* — S. Joseph Morano
*Assistant Examiner* — Jason C Smith
(74) *Attorney, Agent, or Firm* — Sughrue Mion, PLLC

(57) ABSTRACT

Electrical equipment EE arranged in the roof of an electrically driven railway vehicle, said vehicle being equipped with at least one pantograph (2) and a roof line L conveying the current, received from an catenary line (1), from the connection to said pantograph (2) to the electrical driving devices (4) of the vehicle, said electrical equipment EE comprising a circuit-breaking device (3) for protecting said electrical driving devices and being arranged on a mechanical support (40), characterized in that said electrical equipment EE comprises a measuring device DM comprising at least means (33) for measuring the amperage of the current transmitted from the catenary (1) to the roof line L, which means are arranged on said mechanical support (40), and in that said electrical equipment EE comprises a computer (D) which controls the actuation of said circuit-breaking device (3).

6 Claims, 3 Drawing Sheets

U.S. PATENT DOCUMENTS

| | | | | |
|---|---|---|---|---|
| 2003/0183468 A1* | 10/2003 | Stitz et al. | | 191/2 |
| 2004/0216636 A1* | 11/2004 | Emori et al. | | 105/26.05 |
| 2005/0082133 A1* | 4/2005 | Panetta | | 191/2 |
| 2007/0000744 A1* | 1/2007 | Craig et al. | | 191/2 |
| 2010/0006385 A1* | 1/2010 | Aubigny et al. | | 191/2 |

FOREIGN PATENT DOCUMENTS

| | | |
|---|---|---|
| EP | 1 245 432 A1 | 10/2002 |
| JP | 06-054401 A | 2/1994 |
| JP | 08-251701 A | 9/1996 |

\* cited by examiner

ELECTRICAL EQUIPMENT ARRANGED IN THE ROOF OF AN ELECTRICALLY DRIVEN RAILWAY VEHICLE

The present invention relates to electrical equipment arranged in the roof of an electrically driven railway vehicle, said vehicle being equipped with at least one pantograph and a roof line conveying the current, received from an catenary line, from the connection to said pantograph to the electrical devices for driving the vehicle, said electrical equipment comprising at least one apparatus for protecting said electrical driving devices and being arranged on a mechanical support.

A railway vehicle comprises a large amount of equipment in the roof. Single-phase and DC pantographs respectively can thus be found for conveying the current from an catenary line supplied by a direct and single-phase current respectively, to a roof line supplying the vehicle with electric power. High voltage electrical equipment may also be found, such as a single-phase/DC switch, an earthing isolating switch, one or more circuit breakers and complementary equipment of the braking resistor or air-conditioning type.

Because a large amount of equipment is arranged in the roof, the roof of a railway vehicle is particularly congested. This limits the space available in the roof for each piece of equipment already present in the roof as well as the space available in the roof for adding new equipment performing new functions.

However, new regulations, imposing freedom of operation for multiple operators supplying electricity on one network and for multiple operators using this energy on the same network, have recently resulted in a need to measure the electrical energy consumed by a train and in particular taken from the catenary.

This measurement of the electrical energy supplied to a train makes it possible for the supplier to bill the consumers.

Performing this measurement is in principle extremely simple: the amperage consumed, the voltage and the time over which it is consumed have to be recorded, either continuously or by high-frequency sampling, to take into account the variations in these two parameters over time.

In practice, things are further complicated by the fact that the measuring devices are in a high-voltage network environment (from 750 volts direct current to 25,000 volts alternating current depending on the parts of the network travelled though) as far as the acquisition of the variable is concerned, and in a low-voltage environment as far as the generation and processing of the signal are concerned. The insulation between the two environments, known as galvanic insulation, therefore requires particular care and reliability.

The known means for providing this galvanic insulation are for example implemented at the transformers included in the measuring devices, the necessary insulation requiring high-quality dielectric materials to be provided between the primary and secondary windings of transformers of this type, in particular in a sufficient volume to space the conducting parts as far as possible from one another.

Furthermore, this measurement of the energy supplied to the vehicle must be performed with maximum precision to reduce the risk of errors when billing for the energy consumed by the users. This measurement must therefore be performed as close as possible to the power supply of the roof line. It is therefore essential for the equipment performing this function to be arranged in the roof.

One of the objects of the invention is therefore to propose electrical equipment that can be arranged in the roof of a railway vehicle and that is sufficiently compact to be accommodated among the roof machinery of the electrically driven railway vehicle.

A further object of the invention is to arrange in the roof electrical equipment which is involved at least in part in the measurement of the energy supplied to the railway vehicle by the catenary line and which allows the energy supplied to the electrically driven railway vehicle to be measured with high precision.

A further object of the invention is to arrange in the roof electrical equipment which is involved at least in part in the detection of the type of voltage supplied to the railway vehicle by the catenary line.

A further object of the invention is to arrange in the roof electrical equipment which is involved at least in part in the detection of errors in current and current harmonics, allowing the machine to be protected.

For this purpose, the invention therefore relates to electrical equipment arranged in the roof of an electrically driven railway vehicle, said vehicle being equipped with at least one pantograph and a roof line conveying the current, received from an catenary line, from the connection to said pantograph to the electrical driving devices of the vehicle, said electrical equipment comprising a circuit-breaking device for protecting said electrical driving devices and being arranged on a mechanical support, characterised in that said electrical equipment comprises a measuring device comprising at least means for measuring the amperage of the current transmitted from the catenary to the roof line, which means are arranged on said mechanical support, and in that said electrical equipment comprises a computer which controls the actuation of said circuit-breaking device.

Roof equipment of this type has the advantage of forming protective equipment which makes it possible simultaneously to detect overcurrent faults in the vehicle supply circuit and to protect the driving equipment by means of the circuit breaker when an overcurrent fault is detected. A device of this type has good operating safety because the number of joints between the current detection means and the circuit breaker is limited.

Equipment of this type further has the advantage of being self-contained, in terms of external equipment, as regards the switching on or activation thereof.

In other embodiments, the electrical equipment has one or more of the following features, taken individually or in any technically feasible combinations:

the measuring device comprises means for measuring the voltage on the mechanical support;

Equipment of this type has the advantage of allowing the wear of the circuit breaker to be limited. It allows automatic control, closure and opening of the circuit breaker at a predefined (minimum, maximum) voltage value.

said voltage measuring means and amperage measuring means are mounted within a single insulator;

the measuring device comprises a high-voltage environment confined within the first recess provided in the insulator and a low-voltage environment confined in a second recess of said insulator;

at least one of the following pieces of equipment is arranged on the mechanical support:
an earthing isolating switch,
an overvoltage protective device,
an AC circuit breaker;

it comprises the electrical connections between the pieces of equipment arranged on the support;

the measuring device is connected, on the one hand, directly to the pantograph by a single connection and, on the other hand, to the circuit breaker by a single connection;

the measuring device measures the current at the hot spot;

the circuit breaker is a single-phase circuit breaker.

Other features and advantages of the invention will emerge from the following description of an embodiment thereof.

Reference will be made to the accompanying drawings, in which.

Figure 1:
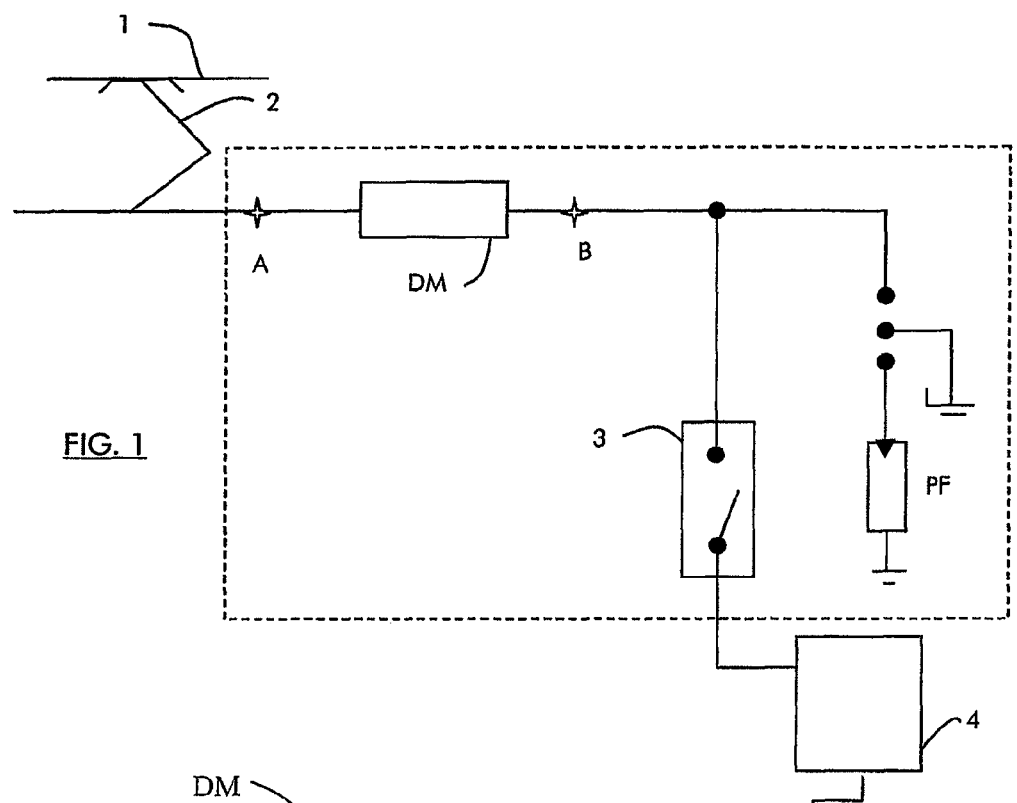
FIG. 1 is a circuit diagram of the pickup of current for a railway vehicle according to a first embodiment of the first aspect of the invention.
Figure 4:
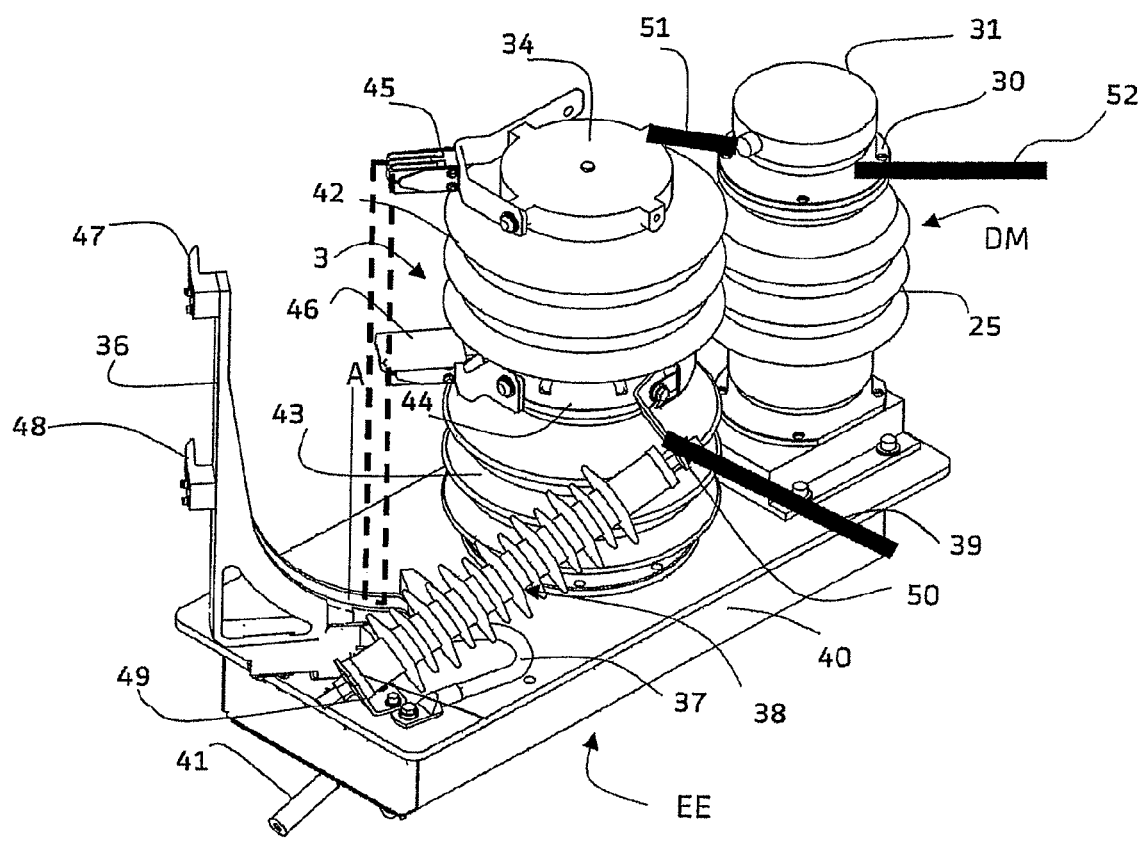

FIG. 4 is a perspective view of electrical equipment according to one possible embodiment of the invention; and FIG. 1 shows the catenary line and the pantograph 2 of the vehicle, the pantograph 2 being shown in the position thereof where it is unfolded so as to come into contact with said catenary 1 in order to establish the connection between the catenary line 1 and the high-voltage roof line, denoted L, of the railway vehicle. The catenary line 1 can be supplied with direct or else single-phase current. The vehicle roof line L conveys the current picked up by the pantograph 2 from the catenary line 1 via the measuring device, denoted DM, to a circuit-breaking device 3, or circuit breaker, which is connected to the electrical driving devices 4 of the vehicle. The circuit breaking device 3 is suitable for protecting the driving equipment of the vehicle in the case of a fault or an overcurrent in the vehicle supply circuit. As well as the circuit-breaking device 3 and the measuring device DM, the electrical equipment EE according to a first embodiment of the invention, shown by dotted lines in FIG. 1, comprises various pieces of electrical machineering equipment arranged in the roof of the railway vehicle and mentioned hereinafter.

An isolating switch 36 for earthing 37 as well as a device 38 for protection against overvoltages.

The earthing isolating switch 36 is capable of being switched manually, electrically or even pneumatically between a first, "service" state in which it is not electrically connected to any component and a second state in which it connects the upstream and downstream of the circuit-breaking device 3 to the earth circuit 37. The device 38 for protection against overvoltages is capable of switching automatically between a first state in which it behaves as a closed cut-out switch and a second state in which it behaves as an open cut-out switch when the voltage between the two terminals thereof passes a predefined threshold.

Figure 2:
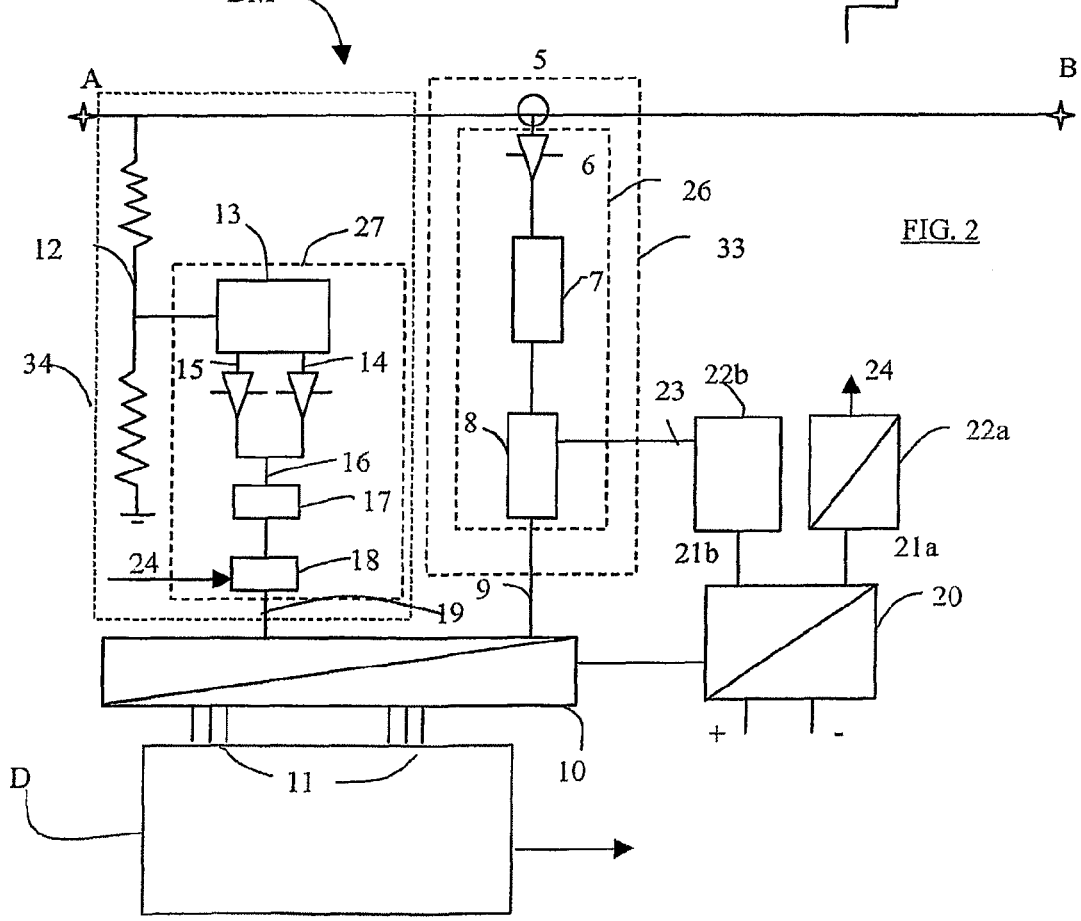
FIG. 2 is a circuit diagram of a measuring device according to a first embodiment of the invention.

FIG. 2 shows the measuring device DM positioned between points A and B of the roof line L.

As is shown in FIG. 2, on this line L, and in a well-known manner, an amperage pickup 5, for example a current measuring shunt, or even an amperage transformer, or even a Hall effect amperage pickup, and a device 6, which makes it possible to provide an analogue calibrated image of the measured current, for example a signal shaping amplifier, emits an analogue signal which is converted into a digital signal by a converter 7, the output of which leads to an electrical/optical converter 8 which transforms the digital electrical signal output by the converter into an optical signal conveyed by an optical fibre 9 towards an optical/electrical converter 10 having outputs 11 for connecting the electronics for exploiting the signal output by the amperage pickup and representing the amperage of the supply current of the high-voltage line L of the machine.

With a voltage divider 12, it is possible to collect, using at least one DC and AC voltage discriminator 13, signals representing these voltages. For example, the signal present at the output 14 of the discriminator 13 is representative of the value of the alternating voltage on the high-voltage line L.

The output 15 is reserved for a signal representing a DC voltage on the high-voltage line L.

One or other of these signals is led to the input 16 of an analogue/digital converter 17, the output of which is connected to the input of an electrical/optical converter 18. The optical signal produced by this converter is guided though an optical fibre 19 to the input of the converter 10 which will produce, in response, at particular ones of its outputs 11, an electrical signal which is to be used by the device in combination with the electrical signal representing the value of the amperage of the supply current.

With a current pickup 5, it is possible to collect signals representing these currents by means of a current discriminator, analogously to the voltage discriminator 13, the direct or alternating current.

The electrical signal representing the value of the amperage of the supply current as well as the signal representing the voltage present on the high-voltage line L, both available at particular outputs 11 of the converter 10, can be transmitted to an energy computer or calculating means, not shown, to calculate the energy provided by the catenary to the railway vehicle based on the signal representing the value of the amperage of the supply current of the catenary and the signal representing the voltage present on the high-voltage line L.

The electrical signal representing the value of the amperage of the supply current as well as the signal representing the voltage present on the high-voltage line L, both available at particular outputs 11 of the converter 10, can be transmitted to a computer or detection means D, to detect current or voltage faults provided by the catenary to the railway vehicle based on the signal representing the value of the amperage of the supply current of the catenary and the signal representing the voltage present on the high-voltage line L.

Some of the components of the device require an electric power supply in order to operate, in particular the electrical/optical or optical/electrical converters such as those denoted 10, 8 and 18. As for the converter 10, it is supplied directly by a battery which is itself connected to a converter 20 for converting DC electrical energy into optical energy in the form of an optical beam emitted by a luminous system such as a diode. The optical beam is guided by optical fibres 21a, 21b towards optical/electrical converters 22a, 22b which have, respectively, an output 24 for supplying the electrical/optical converter 18 and an output 23 for supplying the electrical/optical converter 8.

Advantageously, all of the elements mentioned above are arranged in the insulator 25.

In a variant, the signals representing the amperage and/or the voltage, provided by the outputs 11 of the converter 20, are transmitted to one or more computers, not shown, to detect the excess of current on the roof line L or to detect the overvoltages on this same line or even to detect the harmonics of the current. The computers thus transmit orders to actuators, not shown, to activate the systems for protecting the electric devices for driving the vehicle.

For example, when a computer detects an excess amperage on the roof line, it actuates the opening of the circuit-breaking device 3 to protect the electric devices for driving the vehicle from an excess amperage. Said computer or computers can be located in the housing of the electric equipment EE which is the subject-matter of the invention, i.e. on the support 40.

The computer allowing the activation of the circuit breaker is, for example, mounted within the chamber of the measuring device DM.

Figure 3:
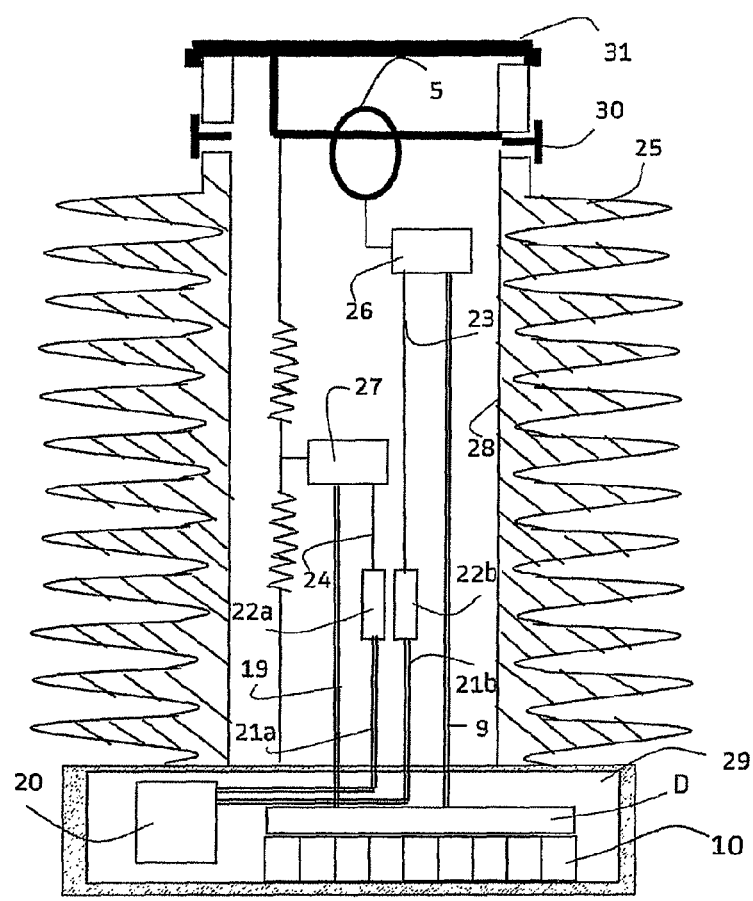
FIG. 3 is a diagram of the location of this measuring device in an insulator of the high-voltage roof line of the railway machine consuming the measured energy.

FIG. 3 shows the installation of the circuit shown in FIG. 1 inside an insulating element 25 and thus shows how complete galvanic insulation is provided in the measuring device according to the invention. In this figure, the majority of the elements described previously are found with the same reference numerals. The elements relating to the processing of the signal from the amperage pickup 5 are grouped schematically in a block 26 supplied with a low voltage by the line 23 and having as an output on an optical fibre 9 the optical signal representing the measured amperage.

Thus the amperage measuring means 33 comprise an amperage pickup 5 and elements relating to the signal of the amperage pickup, grouped schematically in the block 26.

In the same way, the means for processing the voltage signal output by the divider 12 are grouped in a block 27 to which the supply line 24 leads and from which the optical fibre 19 comes from.

Thus, the means for measuring the supply voltage of the train comprise a voltage divider bridge 12 and means for processing the voltage signal output by the divider 12 and grouped in the block 27.

It will therefore be understood from this figure that the high-voltage environment is confined to an upper space 28 provided in the insulator 25, passed through by the roof line L of the railway machine, whilst the low-voltage environment is confined to a lower recess 29 of this insulator. Between the two recesses, only optical fibres form the connection of the different components of the device according to the invention.

Thus, extremely significant galvanic insulation is produced between the high voltage level of the measuring devices and the low voltage level thereof. The conversion of electrical energy into optical energy and the reverse conversion are performed by means of known devices with small dimensions which thus make it possible to mount the measuring device in a small volume and in particular to group voltage measuring means 34 and amperage measuring means 33 in a single insulator 25.

In a variant, the measuring device, denoted DM, only comprises the means 33 for measuring the amperage of the high-voltage supply current of the railway vehicle. More precisely, the measuring device DM is a device for measuring the amperage of the high-voltage supply current of the railway vehicle, grouping into a single insulator the means 33 for measuring the amperage of the current and optionally the optical/electrical converter 10 and/or the low-voltage supply equipment (20, 22b) of the current measuring means, required for the operation of said means.

In this variant, the measuring device DM has the advantage of providing the measurement of the current for the existing machines for which it is desired to add the measurement of the energy while using the measurement of the voltage already present on the roof line L.

The measuring device according to the invention, and more specifically the means 34 for measuring the voltage, may equally be used as a means for identifying the network (from the voltage of the current supplied to the driving machine) which may be 750 volts in direct current, 1,500 volts in direct current, 3,000 volts in direct current (generally processed as in the preceding case), 15,000 volts in alternating current at 16 Hz ⅔, 25,000 volts in alternating current at 50 Hz or 60 Hz, 12,000 volts in alternating current at 60 Hz and 12,000 volts in alternating current at 25 Hz, to mention only the values encountered in the main industrialised countries. In fact, the optical signal present at the output of the fibre 19 is representative of a measurement voltage of which the value itself corresponds to the voltage of the current of the network. Thus, each of the three outputs 11 allocated to the voltage may, via a set of relays in the conversion means 10, be assigned to one of the voltages which the network has to offer. The presence of the signal on only one of the three outputs 11 allocated to the voltage makes it possible to identify the voltage of the network being passed through by the railway machine.

FIG. 4 shows an example of the arrangement of the devices comprised in the electrical equipment EE according to the invention, shown in dashed lines in FIG. 1.

The devices comprised in the electrical equipment EE are arranged on a single aluminium support 40. The devices fixed and electrically connected to this plate are automatically connected to the earth via the fixing of the support plate 40 to the vehicle and individually via the fixing of these devices to this single plate. The electrical equipment EE thus comprises, arranged on a single mechanical support, the following list of equipment: devices for protecting the electrical driving devices and the maintenance staff, an isolating switch 36 for earthing 37, an overvoltage protective device 38, a circuit-breaking device 3 and a measuring device DM as shown in FIG. 3. In this embodiment, the amperage measuring means 33 and the voltage measuring means 34 are arranged within the insulator 25.

A copper connection 52, fixed to a flange 30 arranged in the intermediate part of the insulator 25 within which the measuring device DM is confined, electrically connects the measuring device DM to the foot of the pantograph 2.

A copper connection 51 in the form of a copper cable establishes an electrical connection between the circuit breaker 3 and the measuring device DM and is fixed by one of the two ends thereof to a flange 34 arranged in the upper part of the circuit breaker 3 and by the second end thereof to a flange 31 arranged in the upper part of the measuring device DM.

The body of the circuit breaker 3 comprises two insulators 42 and 43 respectively in the lower part and the upper part, each enclosing electromechanical elements. Said insulators are separated by a flange 44 supporting a clamp 46. The flange 35 also receives a clamp 45.

The flange 44 also receives a copper connection 39, not shown in its entirety, in the form of a copper bar, which establishes the electrical connection between the circuit breaker 3 and the electrical driving devices 4 of the railway vehicle, not shown in FIG. 4.

The support 40 also supports an overvoltage protective device 38.

One of the two ends 49 of said protective device 38 is electrically connected to the earth and is fixed to the support 40 and the second end 50 of said protective device 38 is electrically connected to the circuit breaker and is connected to the flange 44.

The earthing isolating switch 36 comprises a copper bar fixed to the support 40 to which two copper blades 47 and 48 are fixed. The blades 47 and 48 can be received in the clamps 45 and 46 respectively, fixed to the flanges 34 and 44 respectively of the circuit breaker 3, to establish the electrical connection between the circuit breaker 3 and the earthing isolating switch 36. This connection is established when the earthing isolating switch is in the position shown in dashed lines in FIG. 4.

The earthing isolating switch 36 can be displaced manually, electrically or even pneumatically by means of an actuating rod 41 which is adapted to pivot the earthing isolating switch 36 in a rotational movement about the axis A substantially perpendicular to the upper surface of the support 40 and passing through the point at which the earthing isolating switch 36 is fixed to the support 40.

The isolating switch 36 can pivot between a first position, as shown in solid lines in FIG. 4, in which it is in contact which the earth connection 37 and in which the blades are free, and a second position, shown in dashed lines in FIG. 4, in which the blades 47 and 48 are received by the clamps 45 and 46 respectively and in which the earthing isolating switch establishes the connection between the circuit breaker 3 and the mass of the train. The circuit breaker 3 is a single-phase circuit breaker.

In the particularly advantageous embodiment of the invention, shown in FIG. 4, a plurality of electrical devices, performing a plurality of different functions which need to be ensured by a current pickup system for railway machinery, are fixed to a single mechanical support.

This equipment thus provides a plurality of different functions on a single support in a compact manner, and therefore is of low dimensions and has a limited number of constituent parts, and can thus easily be integrated into the roof.

This equipment has also the advantage of having more than two electrical power connections with external equipment (pantograph 2, electrical driving devices 4). This configuration allows to limit the number and the length of the external electrical connections to be done between the various equipment on the roof and thus to limit the congestion of the roof.

The presence on the support 40 of the measuring device DM comprising means for measuring the current 34 makes it possible to provide an electrical device performing a new current measuring function as compared with the existing devices.

The arrangement on a single support of protective devices such as a circuit breaker 3, an earthing isolating switch 36, an overvoltage protective device 38 and a measuring device DM mounted in a single insulator of the means 33 for measuring the amperage of the current and of the voltage measuring means 34 makes it possible to provide a device integrating an additional function as compared to existing devices without the current measuring means 33, while limiting the extra space required for measuring the current. Thus, it is possible to perform an additional function of measuring the energy in a space identical to that occupied in order to perform the circuit-breaking, earthing and overvoltage protection functions, by adding to a support, initially provided for these functions, a measuring device DM.

The measurement of the current also makes it possible to perform protection functions requiring the identification of the value of the current by sending the signal representing the amperage available on the roof line L to a computer which controls actuators for activating the protective device, arranged on the mechanical support 40. The computer can be an integral part of the electrical equipment EE arranged on the roof.

In another embodiment, which is not shown, the electrical equipment EE comprises a single protective device, a circuit-breaking device 3 and a measuring device DM comprising at least one measuring means selected from an amperage measuring means 33 and a voltage measuring means 34.

The connection of the pantograph 2 directly to the measuring device DM makes it possible to perform the measurement of the amperage of the current on the roof line L as close as possible to the pantograph. This arrangement has the advantage of limiting the losses in the electrical connections and/or in the electrical equipment which may be positioned between the pantograph and the measuring device DM. The amperage is said to be measured at the "hot spot". This configuration makes it possible to measure the amperage of the current and thus the energy transmitted by the catenary to the roof line with the greatest possible precision.

In a variant, in which the means 33 for measuring the amperage of the current and the voltage measuring means 34 are mounted in two different insulators, the means 33 for measuring the amperage of the current are arranged on a single support 40 with at least one of the pieces of electrical equipment selected from a circuit breaker 3, an earthing isolating switch 36, and an overvoltage protective device 38.

This arrangement is advantageous if the voltage measurement is performed elsewhere in the current pickup circuit and if only the amperage of the current transmitted by the catenary to the roof line is required.

In a variant in which the means 33 for measuring the amperage of the current and the voltage measuring means 34 are mounted in two independent insulators, the two insulators, in which the means 33 for measuring the amperage of the current and the voltage measuring means 34 are mounted, are arranged on a single support 40 with at least one of the pieces of electrical equipment for protection selected from a circuit breaker 3, an earthing isolating switch 36, and an overvoltage protective device 38. This configuration makes it possible to alter the electrical connections between the voltage measuring means 34, the current measuring means 33 and the other electrical equipment arranged on the plate and to the pantograph 2 and the electrical driving devices 4. Thus, the voltage measurement and the current measurement can be performed at two different points in the current pickup circuit while keeping the current measuring means 33 and voltage measuring means 34 on a single mechanical support.

The invention claimed is:

1. Electrical equipment arranged on a roof of an electrically driven railway vehicle, said vehicle being equipped with at least one pantograph and with a roof line conveying a supply current, received from a catenary line, from a connection to said pantograph to electrical driving devices of the vehicle,
wherein said electrical equipment comprises, arranged on a mechanical support fixed on the roof of the vehicle:
a circuit-breaking device for protecting said electrical driving devices;
a measuring device comprising at least means for measuring the amperage and means for measuring the voltage of the supply current transmitted from the catenary line to the roof line, said voltage measuring means and amperage measuring means being mounted within a single insulator; and
a computer which controls the actuation of said circuit-breaking device based on a first signal representing the value of the amperage of the supply current of the catenary line delivered by the means for measuring the amperage and a second signal representing the voltage present on the catenary line delivered by the means for measuring the voltage, and
wherein said measuring device is connected, on the one hand, directly to the pantograph by a first single connection and, on the other hand, to the circuit breaker by a second single connection.

2. Electrical equipment according to claim 1, wherein the measuring device comprises a high-voltage environment confined within a first recess provided in an insulator and a low-voltage environment confined in a second recess of said insulator.

3. Electrical equipment according to claim 1, wherein at least one of the following pieces of protective equipment is arranged on the mechanical support:
- an isolating switch for earthing,
- an overvoltage protective device,
- an AC circuit breaker.

4. Electrical equipment according to claim 1, wherein it comprises electrical connections between the equipment arranged on the support.

5. Electrical equipment according to claim 1, wherein the measuring device measures the current at a hot spot.

6. Electrical equipment according to claim 1, wherein the circuit breaker is a single-phase circuit breaker.

* * * * *